United States Patent
Weis et al.

(10) Patent No.: US 9,007,117 B2
(45) Date of Patent: Apr. 14, 2015

(54) SOLID-STATE SWITCHING DEVICE HAVING A HIGH-VOLTAGE SWITCHING TRANSISTOR AND A LOW-VOLTAGE DRIVER TRANSISTOR

(71) Applicant: Infineon Technologies Dresden GmbH, Dresden (DE)

(72) Inventors: Rolf Weis, Dresden (DE); Anthony Sanders, Weißenfeld (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 13/957,864

(22) Filed: Aug. 2, 2013

(65) Prior Publication Data
US 2015/0035586 A1 Feb. 5, 2015

(51) Int. Cl.
*H03K 17/687* (2006.01)
*H03K 17/08* (2006.01)

(52) U.S. Cl.
CPC ...................................... *H03K 17/08* (2013.01)

(58) Field of Classification Search
USPC .......................................... 327/430, 434–436
See application file for complete search history.

(56) References Cited

U.S. PATENT DOCUMENTS

| | | | | |
|---|---|---|---|---|
| 4,663,547 A * | 5/1987 | Baliga et al. | .................. | 327/377 |
| 5,396,085 A * | 3/1995 | Baliga | ............................. | 257/77 |
| 5,406,096 A * | 4/1995 | Malhi | ............................ | 257/114 |
| 6,157,049 A * | 12/2000 | Mitlehner et al. | ............... | 257/77 |
| 6,605,978 B1 * | 8/2003 | Halamik et al. | ............... | 327/430 |
| 6,614,281 B1 * | 9/2003 | Baudelot et al. | ............... | 327/321 |
| 7,206,178 B2 * | 4/2007 | Friedrichs et al. | ........... | 361/93.1 |
| 7,501,670 B2 | 3/2009 | Murphy | | |
| 7,768,758 B2 * | 8/2010 | Maier et al. | .................. | 361/93.1 |
| 7,777,553 B2 * | 8/2010 | Friedrichs | ...................... | 327/436 |
| 7,915,645 B2 * | 3/2011 | Briere | ........................... | 257/195 |
| 7,939,857 B1 * | 5/2011 | Wyatt | ............................ | 257/205 |
| 8,017,978 B2 * | 9/2011 | Lidow et al. | ................... | 257/194 |
| 8,084,783 B2 * | 12/2011 | Zhang | ........................... | 257/133 |
| 8,228,113 B2 * | 7/2012 | Domes | .......................... | 327/427 |
| 8,228,114 B1 * | 7/2012 | Cilio | ............................. | 327/430 |
| 8,670,220 B2 * | 3/2014 | Pansier | ........................... | 361/86 |
| 8,723,589 B2 * | 5/2014 | Biela et al. | ..................... | 327/430 |
| 8,766,375 B2 * | 7/2014 | Bramian et al. | .............. | 257/392 |
| 2006/0113593 A1 | 6/2006 | Sankin et al. | | |

* cited by examiner

*Primary Examiner* — Kenneth B. Wells
(74) *Attorney, Agent, or Firm* — Murphy, Bilak & Homiller, PLLC (57) ABSTRACT

According to an embodiment, a solid-state switching device includes a high-voltage switching transistor including a source, a drain and a gate, and being adapted for switching a high voltage on the basis of a switching signal, and a switching driver circuit operationally connected to the high-voltage switching transistor, the switching driver circuit including a low-voltage driver transistor including a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

18 Claims, 6 Drawing Sheets

SOLID-STATE SWITCHING DEVICE HAVING A HIGH-VOLTAGE SWITCHING TRANSISTOR AND A LOW-VOLTAGE DRIVER TRANSISTOR

TECHNICAL FIELD

Embodiments described herein relate to solid-state power switches including MOSFETs, and in particular relate to driver configurations for solid-state power switches. Further embodiments described herein relate to a method for driving solid-state power switches.

BACKGROUND

Solid-state power switches, in particular field-effect controlled switching devices such as a Metal Oxide Semiconductor Field-effect Transistor (MOSFET) or an Insulated Gate Bipolar Transistor (IGBT), have been used for various applications, including, but not limited to, use as switches in power supplies and power converters, electric cars, air-conditioners, and even electrical grids used by renewable energy suppliers. Particularly with regard to power devices capable of switching large currents and/or operating at higher voltages, controlling solid-state power switches in such devices can be based on different designs of driver circuits.

Typically, such driver circuits are operated in a low-voltage region, whereas the solid-state power switches are operated at high voltages. Furthermore, driver circuits included in high power switching devices are designed for controlling solid-state switches that have positive or negative control voltages. The gate voltages for power switches can be positive or negative. Conventionally, driver circuits are connected to logic circuits providing control signals for the driver circuit connected to the respective logic circuit. Typically, both the logic circuits and the driver circuits are operated in the low-voltage region.

Different functional components, such as logic circuits, driver circuits and solid-state power switches, can be manufactured by means of different technologies, resulting in different pieces of semiconductor substrates. Typically, logic circuits and driver circuits are silicon-based, wherein the respective substrate is directly connected to ground, e.g., to improve cooling of the respective component. For solid-state power switches based on silicon, vertical arrangements with a drain terminal at a backside and gate/source terminals at a front side can be used. For higher switching frequencies and higher power density, wide-bandgap-based solid-state power switches such as SiC-JFETs or GaN-HEMTs switches can be used. These devices can be designed as normally-on devices, which can be manufactured—for a given blocking voltage and a given on-resistance—up to ten times smaller in chip size than comparable solid-state power switching devices based on silicon, which are usually normally-off devices. As a current flow in these devices is parallel to a substrate surface, these devices can be setup with source terminal at the backside and gate/drain terminals at the front side of the substrate. For high frequencies and efficient cooling during high current operation, short connections with low inductance, large connection areas between the different functional components, and a high integration density are desired.

In view of the above, there is a need for improving driver configuration for high-voltage switches.

SUMMARY

According to an embodiment, a solid-state switching device includes a high-voltage switching transistor including a source, a drain and a gate, and being adapted for switching a high voltage on the basis of a switching signal, and a switching driver circuit operationally connected to the high-voltage switching transistor, the switching driver circuit including a low-voltage driver transistor including a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

According to an embodiment, a solid-state switching device includes a high-voltage switching transistor including a source, a drain and a gate, and being adapted for switching a high-voltage on the basis of a switching signal, and an integrated logic switching driver circuit operationally connected to the high-voltage switching transistor, the integrated logic switching driver circuit including a logic circuit adapted for generating the switching signal for the high-voltage switching transistor, and a switching driver circuit including a low-voltage driver transistor including a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

According to an embodiment, a half-bridge circuit includes at least two solid-state switching devices connected in series, each switching device having a high-voltage switching transistor adapted for switching a high voltage on the basis of a switching signal, and a switching driver circuit operationally connected to the high-voltage switching transistor, the switching driver circuit including a low-voltage driver transistor including a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

According to an embodiment, a method for switching a high voltage includes generating a switching signal, applying the switching signal at a low-voltage driver transistor including a source, a drain and a gate, transferring the switching signal to a high-voltage switching transistor, and, on the basis of the transferred switching signal, switching the high voltage by means of the high-voltage switching transistor connected in series to the low-voltage driver transistor and being arranged source-down on top of the drain of the low-voltage driver transistor.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference numerals designate corresponding parts. In the drawings.

DETAILED DESCRIPTION

In the following Detailed Description, reference is made to the accompanying drawings, which form a part hereof and in which are shown by way of illustration specific embodiments in which the invention can be practiced. In this regard, directional terminology, such as "top", "bottom", "front", "back", "leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments can be utilized and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning of IGFET (insulated-gate field-effect transistor) and MISFET (metal-insulator-semiconductor field-effect transistor), respectively. It is noted here, that the electrode material is not restricted to a metal, rather any other conducting material, such as amorphous or polysilicon material, carbon or any other semiconductor material, can be used.

Field-effect controlled switching devices such as Metal Oxide Semiconductor Field-effect Transistors (MOSFETs) or Insulated Gate Bipolar Transistors (IGBTs) have been used for various applications, including as switches in power supplies and power converters, electric cars, air-conditioners, and even stereo systems. Particularly with regard to power devices capable of switching large currents and/or operating at higher voltages, a low resistance in the conducting on-state is often desired. For example, this means that for a given current to be switched, the voltage drop across the switched on FET, i.e., the source-drain voltage, is desired to be low. On the other hand, the losses occurring during switching off or commutating of the FET are often also to be kept small, to minimize the overall losses.

The term "solid-state power switch" as used in this specification is intended to describe a semiconductor device with high voltage and/or high current switching capabilities. In other words, power semiconductor devices are intended for high current, typically in the Ampere range or higher. Within this specification the terms "solid-state power switch", "solid-state switching device" and "power semiconductor device" are used synonymously.

In the context of the present specification, a semiconductor region in which an inversion channel can be formed and/or controlled by the field effect is also referred to as a body region. As used herein, the term "chip package" is intended to be representative of an ensemble of (internal) circuit elements, e.g., circuit components, each integrated on a single semiconductor substrate. Thereby, these circuit components can be arranged in a package in a manner such that only a small space is consumed and few terminals for the internal and external connections need to be provided.

The term "field-effect" as used in this specification is intended to describe the electric field mediated formation of an "inversion channel" and/or control of conductivity and/or shape of the inversion channel in a semiconductor region. The conductivity type of the channel region is typically changed, i.e., inverted, for either forming a unipolar current path between two semiconductor regions of the inverted conductivity type, which are adjacent to the channel region (normally-off transistor), or for forming an interruption of the unipolar current path between two semiconductor regions of the same conductivity type, which are adjacent to the channel region (normally-on transistor).

Above a threshold voltage Vth between the gate electrode and the body region, the inversion channel is formed and/or controlled due to the field-effect in a channel region of the body region adjoining the dielectric region or dielectric layer. The threshold voltage Vth typically refers to the minimum gate voltage necessary for the onset of a unipolar current flow between the two semiconductor regions of the first conductivity type, which can form the source and the drain of a transistor structure. For normally-on transistors, the threshold voltage can be defined by a voltage between the gate electrode and the body region, which is maintained in order to provide a conducting path between two semiconductor regions of the first conductivity type, i.e., a source and a drain of a transistor structure. An application of a voltage below the threshold voltage for normally-on transistors results in an interruption of the conduction path.

In the context of the present specification, the term "field-effect structure" is intended to describe a structure which is formed in a semiconductor substrate or semiconductor device and has a gate electrode that is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_2N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$).

In the context of the present specification, the term "gate electrode" is intended to describe an electrode that is situated next to and insulated from the body region, and configured to form and/or control a channel region, which typically includes the inversion channel, through the body region. The terms "electrical connection" and "electrically connected" describe an ohmic connection between two elements.

As used herein, the terms "half-bridge" or "half-bridge circuit" are intended to be representative of a circuit configuration wherein two solid-state power switches are connected in series, the connection terminal being a half-bridge output terminal. An output voltage present at the output terminal can then be switched, e.g., between a high-voltage potential and ground potential. This switching mode can be achieved by mutually controlling the two solid state power switches by means of a switching signal. A control procedure ensures that only one of the two solid state power switches is turned on while the other one of the two solid state power switches is turned off, in order to avoid a short circuit.

As used herein, the term "cascode circuit" is intended to be representative of a circuit configuration wherein two transistors are connected in series, and wherein the gate terminal of one of the two transistors can be used as a control terminal for switching through a conduction path represented by the series connection of the two transistors.

According to embodiments described herein, the switching device is capable of switching and controlling high voltages and currents. The switching device can be controlled by a combined logic-driver circuit. As used herein, the term "integrated logic switching driver circuit" is intended to be representative of an integrated circuitry that includes circuit components of both a logic circuit and a switching driver circuit.

According to embodiments described herein, the logic-driver circuit can be operated in a low-voltage region, wherein a high-voltage switching transistor connected to the logic-driver circuit can be operated at high voltages. Thus, circuit components designed for low voltages can be combined in the integrated logic switching driver circuit.

Figure 1:
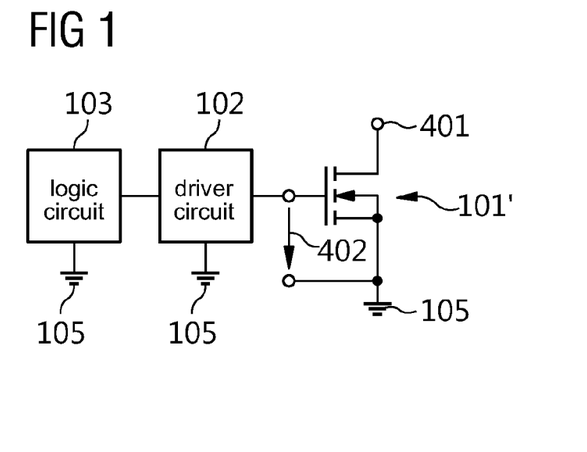
FIG. 1 illustrates a block diagram of a switching device including separate logic and driver circuits, for an explanation of high-voltage switching.

With reference to FIG. 1, a block diagram of a switching device including separate logic and driver circuits is illustrated, for an explanation of high-voltage switching. An enhancement-type n-channel high-voltage switching transistor 101', which is connected with its drain terminal to a drain potential at drain terminal 401 and with its source terminal to ground 105, is controlled by a gate voltage 402. The gate voltage 402 is provided by a separate driver circuit 102. For a positive gate voltage 402 provided with respect to the ground potential 105 and above a predetermined threshold value, the n-channel high-voltage switching transistor 101' can be switched on such that a conduction path between its drain terminal (switching terminal 401) and its source terminal (ground 105) is established.

According to the circuit configurations illustrated in FIG. 1, the n-channel high-voltage switching transistor 101" is a field-effect transistor (FET) of enhancement type, i.e., a normally-off transistor element. The driver circuit 102 shown in FIG. 1 is connected to a logic circuit 103 adapted for providing a switching signal for the high-voltage switching transistor 101". Thereby, a high voltage can be switched on the basis of the switching signal.

Figure 2:
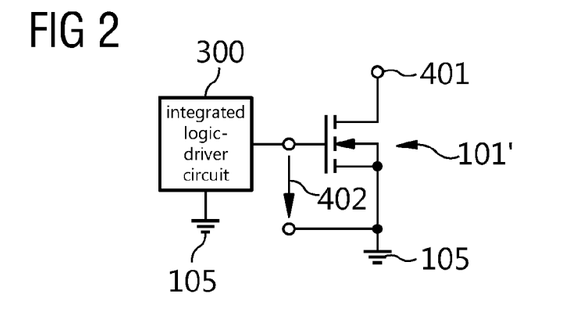
FIG. 2 illustrates a block diagram of a circuitry wherein the logic circuit and the driver circuit are combined in an integrated logic-driver circuit, for an explanation of high-voltage switching.

Referring now to FIG. 2, a block diagram of a circuitry is illustrated wherein the logic circuit and the driver circuit are combined, for an explanation of high-voltage switching. As shown, the driver circuit 102 and the logic circuit 103 are integrated into a single logic-driver circuit 300. Again, a gate voltage 402 is used as a control signal for the high-voltage switching transistor 101", the control signal being in the form of an appropriate voltage level above a predetermined threshold voltage Vth. Above the threshold voltage Vth between a gate electrode and a body region of the transistor, an inversion channel is formed and/or controlled due to the field-effect in a channel region of the body region.

The circuit setups illustrated in FIGS. 1 and 2 are related to the control of enhancement mode high-voltage switching transistors. Thus, control voltages of that kind of n-channel field-effect transistors are provided with a positive gate potential with respect to ground 105.

Figure 3:
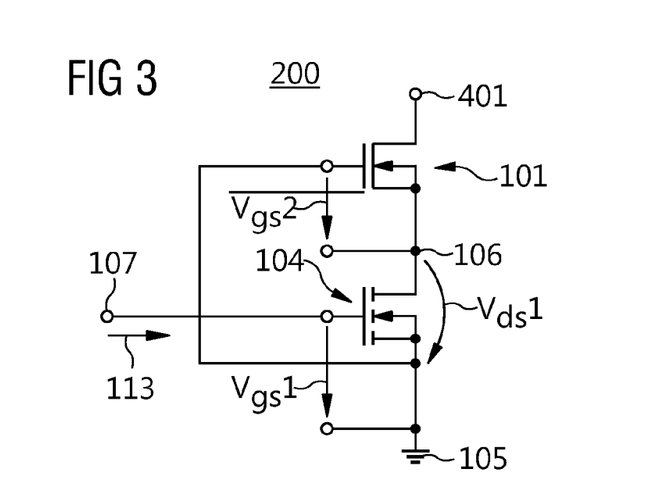
FIG. 3 illustrates a schematic circuit diagram of a cascode connection of a low-voltage driver transistor and a high-voltage switching transistor, according to embodiments.

With reference to FIG. 3, a cascode circuit 200 including two field-effect transistors according to embodiments that can be combined with other embodiments described herein is illustrated. The cascode circuit 200 includes a high-voltage switching transistor 101 and a low-voltage driver transistor 104. The high-voltage switching transistor 101 is connected in series to the low-voltage driver transistor 104. Thereby, the drain terminal of the low-voltage driver transistor 104 is connected, at an interconnection terminal 106, to the source terminal of the high-voltage switching transistor 101. The drain terminal of the high-voltage switching transistor 101 is connected to a switching terminal 401, which can be connected to a high voltage to be switched. The gate terminal of the high-voltage switching transistor 101 is connected to ground 105, and the gate terminal of the low-voltage driver transistor 104 is connected to a control terminal 107, through which a control signal 113 can be provided. As explained herein below with reference to FIG. 4, the control signal 113 can be generated by a switching driver circuit operated in a low-voltage region.

In the exemplary embodiment illustrated in FIG. 3, the low-voltage driver transistor 104 is a field-effect enhancement-mode transistor. Thereby, the low-voltage driver transistor 104 according to the embodiment is in normally-off state and can be switched on by applying a positive gate-source voltage Vgs1 at the control terminal 107. If the low-voltage driver transistor 104 is switched on, a drain-source voltage Vds1 of this transistor is at a minimum. Thus, a potential at the interconnection terminal 106 is close to the ground potential 105. This, in turn, results in a gate-source voltage Vgs2 of the high-voltage switching transistor 101 of approximately zero. Typically, a low-voltage region for logic circuits includes a range up to 5 volts, and a low-voltage region provided for driver circuits includes a range from 10 volts to 20 volts, whereas the high-voltage region can extend to up to the range from 40 volts to 1000 volts and above.

According to an embodiment, which can be combined with other embodiments described herein, the high-voltage switching transistor 101 can be provided as a depletion field-effect transistor, i.e., a normally-on transistor. According to yet another modification, the high-voltage switching transistor 101 is selected from the group consisting of a MOSFET, a MISFET, an IGFET, an IGBT, a JFET, a HEMT, a FINFET or a nanotube device.

According to further embodiments which can be combined with embodiments described herein, the high-voltage switching transistor 104 can include one of the following materials or compositions thereof: Si, SiO, SiN, Ge, Ga, Al, GaAs, GaN, C, In, InP, SiC, HfO.

The high-voltage switching transistor 101 according to an embodiment can be switched off by applying a negative gate-source voltage Vgs2 at its gate terminal, i.e., the high-voltage switching transistor 101 provided as a depletion transistor transits into its off-state if the potential applied at its gate terminal is negative with respect to the potential applied at its source terminal. Thus, although the gate terminal of transistor 101 remains connected to ground 105, the high-voltage transistor 101 can switch off because the source terminal, i.e., the interconnection terminal 106, is raised at a potential that is positive with respect to ground 105.

On the other hand, as the low-voltage driver transistor 104 is provided as a field-effect enhancement-mode transistor, i.e., a normally-off transistor, the control terminal 107 of the cascode circuit 200 can be used for controlling the high-voltage switching transistor 101. The control terminal of the cascode circuit 200 is connected to the gate terminal of the low-voltage driver transistor 104. The gate terminal of the high-voltage switching transistor 101 is connected to the source terminal of the low-voltage driver transistor 104 and to ground potential 105.

Figure 4:
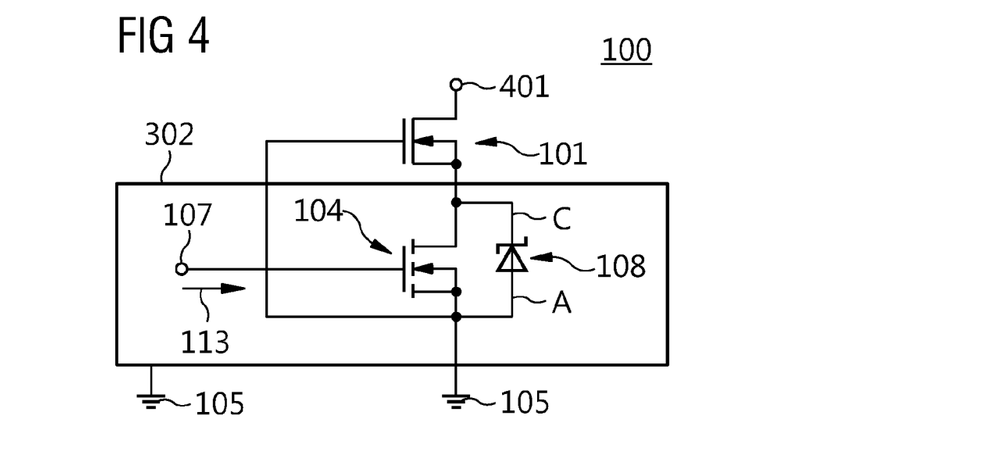
FIG. 4 illustrates an integrated logic-driver circuit for controlling a high-voltage switching transistor, according to embodiments.

FIG. 4 illustrates a switching device 100 including driver circuit configuration, according to an embodiment that can be combined with other embodiments described herein. The circuit configuration includes the high-voltage switching transistor 101 and the low-voltage driver transistor 104 that have been described herein above with reference to FIG. 3.

The low-voltage driver transistor 104 can include a protection diode 108 (body diode) connected in parallel to its source-drain conducting path, wherein the anode terminal A of the diode is connected to the source of the driver transistor 104 and the cathode terminal C is connected to the drain of the driver transistor 104. The protection diode 108 can be represented by a Zener diode and can be used for protecting the low-voltage driver transistor 104 against over-voltages. According to an alternative embodiment, which can be combined with other embodiments herein, the protection diode can be formed as a body diode of the low-voltage driver transistor 104.

This so-called body diode 108 can then be formed by a pn-junction between a respective drift region and a body region of the field-effect transistor (FET). Due to the intrinsic body diode, a FET can block a current only in one direction but not in both directions.

Furthermore, the circuit configuration shown in FIG. 4 includes an integrated logic switching driver circuit 302 which can be operated in low-voltage region and the high-voltage switching transistor 101. The term "integrated" in the context of the present description is to be understood as an arrangement of circuit elements provided on the same chip, e.g., on the same piece of silicon, e.g., on a single semiconductor substrate. As has been described herein with respect to FIG. 3, the high-voltage switching transistor 101, which can be a normally-on transistor, and which can need a negative gate-source voltage for blocking its source-drain path, can be arranged separately with respect to the integrated logic switching driver circuit 302. According to yet another modification, the switching driver circuit 301 shown in FIG. 5, the logic circuit 103 and/or the low-voltage driver transistor 104 can be monolithically integrated into a single semiconductor component, e.g., on a single semiconductor substrate.

The integrated logic switching driver circuit 302 can include the low-voltage driver transistor 104 on the same chip. The control signal 113 for the low-voltage driver transistor can thus be generated internally within the integrated logic switching driver circuit 302. Thereby, a voltage in a low-voltage region can be applied at the control terminal 107, i.e., low voltages can be applied as a positive gate-source potential adapted for switching on the low-voltage driver transistor 104. Although not shown in FIG. 4, the integrated logic switching driver circuit 302 can further include logic circuitry adapted for providing the control signal 113 controlling the low-voltage driver transistor 104.

Figure 5:
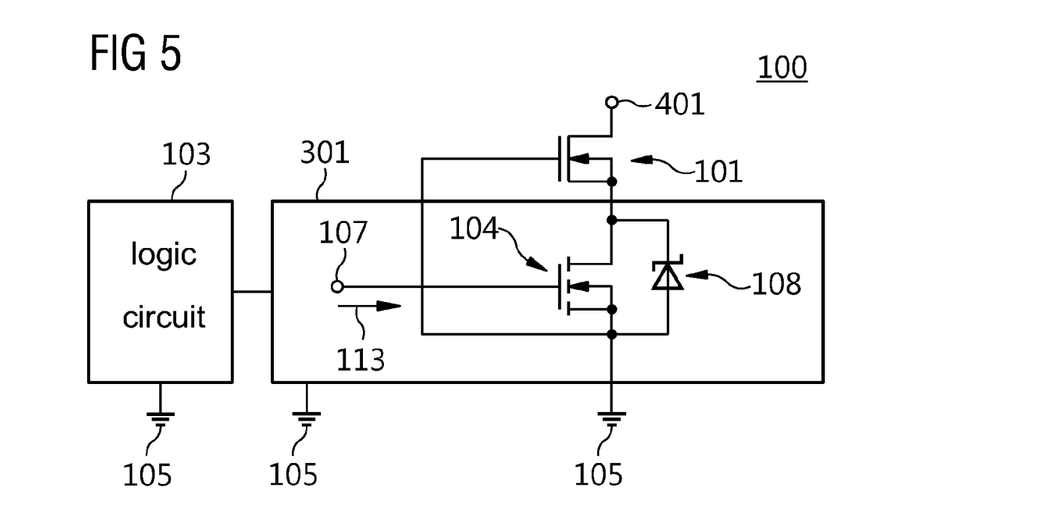
FIG. 5 illustrates a switching driver circuit connected to a logic circuit and being adapted for controlling a high-voltage switching transistor, according to embodiments.

FIG. 5 illustrates a high-voltage switching device 100 according to yet another embodiment which can be combined with embodiments described herein. Similar to the switching device 100 described herein above with respect to FIG. 4, the high-voltage switching device 100 shown in FIG. 5 includes an integrated circuit component operating in the low-voltage region, i.e., an integrated switching driver circuit 301. As a modification of the circuit configuration of FIG. 4, a logic circuit 103 is arranged separately from the switching driver circuit 301 and is operationally connected to the switching driver circuit 301. In addition to that, or alternatively, the switching driver circuit 301, the logic circuit 103 and/or the low-voltage driver transistor 104 can be monolithically integrated into a single semiconductor component.

At the control terminal 107 connected to the gate terminal of the low-voltage driver transistor 104, an appropriate control signal 113 provided by the integrated switching driver circuit 301 can be applied. Generation of the control signal 113 can be based on signals generated by means of the logic circuit 103. The remaining circuit function of the setup shown in FIG. 5 is similar to the function of the circuit arrangement according to the description with respect to FIG. 4, an explanation of which is omitted here in order to avoid a redundant description.

Figure 6:
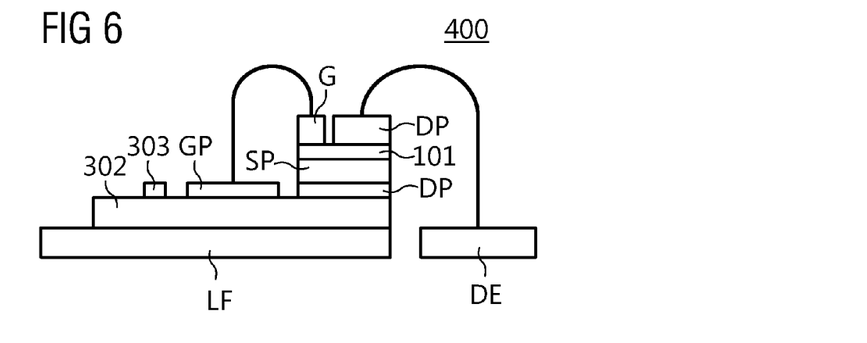
FIG. 6 illustrates a cross-sectional view of a chip package including the integrated logic switching driver circuit, according to embodiments.

FIG. 6 illustrates a vertical cross-sectional view through a semiconductor chip package 400, according to an embodiment that can be combined with other embodiments described herein. A base of the semiconductor chip package 400 is provided by a lead frame LF, onto which the switching driver circuit 301 or the integrated logic switching driver circuit 302 is arranged.

The integrated logic switching driver circuit 302 and/or the low-voltage driver transistor 104 of the solid-state switching device 100 can be monolithically integrated into a single semiconductor component. The term "solid-state switching device" denotes an electrical power switch and is intended to describe a semiconductor device on a single semiconductor substrate with high voltage and/or high current switching capabilities. Power semiconductor devices are intended for high current, typically in the Ampere range or higher. Within this specification the terms "solid-state power switch", "solid-state switching device" and "power semiconductor device" are used synonymously.

According to an embodiment that can be combined with other embodiments described herein, the integrated logic switching driver circuit 302 and the high-voltage switching transistor 101 can include a lateral structure. In this way, a semiconductor chip package 400 with two lateral circuit elements that are arranged on top of each other can be provided. In lateral technology, circuit elements can be provided with a source connection that is located at a lower side of the element. This arrangement permits the design of a stack configuration wherein an upper circuit element can be mounted "source-down" on top of a lower circuit element. Thereby, a drain pad DP of the logic switching driver circuit 302, a source pad SP of the high-voltage switching transistor 101, the transistor body, and the drain pad DP of the high-voltage switching transistor 101 can be arranged on top of each other, in a vertical direction. In other words, the logic switching driver circuit 302 and the high-voltage switching transistor 101 can be provided as a stack, e.g., as a single semiconductor substrate. The logic switching driver circuit 302 is arranged directly onto a lead frame LF. The gate G of the high-voltage switching transistor 101 is connected to a gate pad GP provided on the upper surface of the logic switching driver circuit 302. In other words, kind of a "piggy-back" configuration for the high-voltage switching transistor onto the integrated logic switching driver circuit 302 can be provided. The source metallization (source pad) SP of the high-voltage switching transistor 101 can be provided in a direct electrical contact with the drain pad DP provided on the upper side of the integrated logic switching driver circuit 302. The integrated logic switching driver circuit 302 can include one or more input terminals 303 adapted for inputting an electrical signal and/or a bit stream that then can be processed by the logic circuit included in the integrated logic switching driver circuit 302. Thereby, the control signal 113 can be generated, and input to the control terminal of the low voltage driver transistor 104 (see FIG. 5).

It is thus a benefit of the chip configuration depicted in FIG. 6 that only two pads are required on the chip of the integrated logic switching driver circuit 302, i.e., the gate pad GP for connecting the gate of the high-voltage switching transistor 101 and the drain pad DP of the low-voltage driver transistor 104 to which the source pad of the high-voltage switching transistor 101 can be connected. Thereby, the high-voltage switching transistor 101 can be mounted directly onto the integrated logic switching driver circuit 302 with the low-voltage driver transistor 104. In other words, as elucidated in FIG. 6, the high-voltage switching transistor 101 can be arranged—as kind of a "source-down" circuit element—directly on top the drain pad DP of the low-voltage driver transistor 104. Moreover, the integrated logic switching driver circuit 302 can be provided as a "source-down" circuit element such that two "source-down" circuit elements both provided in lateral technology are arranged on top of each other.

Although not shown in FIG. 6, the integrated logic switching driver circuit 302 can be replaced by the switching driver circuit 301 alone, which has been indicated in FIG. 5. The switching driver circuit 301 can then be provided with one or more additional connection terminals, such as input terminals 303. As an example, one input terminal 303 adapted for connecting, e.g., a separate logic circuit 103 indicated in FIG. 5, is shown in FIG. 6.

It is noted here that the high-voltage switching transistor 101 and the switching driver circuit 301 or the integrated logic switching driver circuit 302 form a single semiconductor chip package 400, e.g., a one-piece electronic circuit component, e.g., a component on a single semiconductor substrate. The single semiconductor chip package 400 includes externally accessible connection terminals that are represented by, but are not limited to, the drain electrode DE, the lead frame LF being connected to ground, and an optional output electrode OE (output pad). It is noted here that the switching driver circuit 301, the logic circuit 103 and/or the low-voltage driver transistor 104 can be monolithically integrated into a single semiconductor component.

Due to the lateral technology used for chip package setup, only the gate pad GP and the drain pad DP need be provided at the switching driver circuit 301 and the integrated logic switching driver circuit 302, respectively, for connecting circuits 301, 302 to the high-voltage switching transistor 101. The switching driver circuit 301 and the integrated logic switching driver circuit 302, respectively, can be bonded onto the same lead frame LF.

Figure 7:
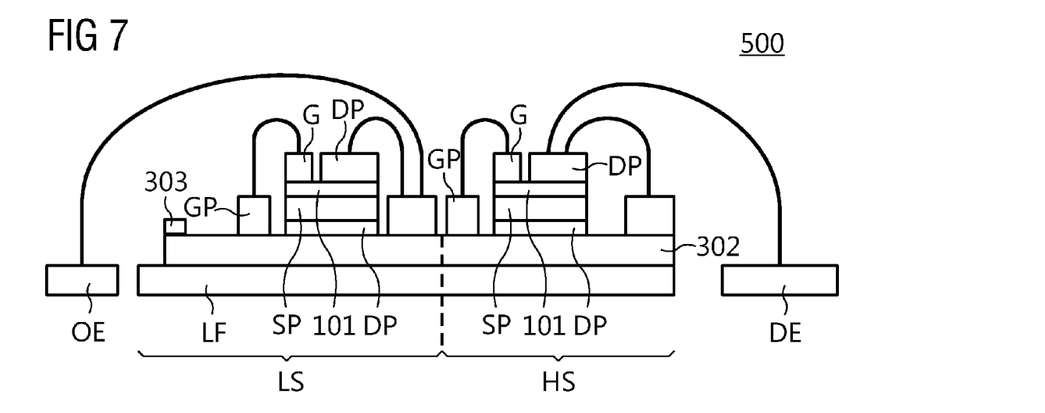
FIG. 7 illustrates a cross-sectional view of another chip package including integrated logic switching driver circuits for low side and high side circuitry of a half-bridge circuit, according to embodiments.

FIG. 7 illustrates a cross-sectional view of another semiconductor chip package, according to an embodiment that can be combined with other embodiments described herein. The semiconductor chip package 500 shown in FIG. 7 includes circuit components of a half-bridge circuitry, i.e., two high-voltage switching transistors 101 are provided on a single semiconductor substrate. Thereby, the half-bridge semiconductor chip package 500 includes low-side circuit components arranged at the half-bridge low side LS, and high-side circuit components arranged at the half-bridge high side HS. It is noted here that—due to the lateral chip design technology—an entire half-bridge circuitry can be realized as system-in-a-package component. According to an embodiment which can be combined with other embodiments described herein, the integrated logic switching driver circuit 302 and the high-voltage switching transistor 101 can include a lateral structure. In this way, a semiconductor chip package 500 with lateral circuit elements that are arranged on top of each other can be provided. The source metallization (source pad) SP of the respective high-voltage switching transistors 101 can thus be provided in a direct electrical contact with the respective drain pads DP provided on the upper side of the integrated logic switching driver circuit 302, which in turn can be provided as a on a single semiconductor substrate.

Both the low-side circuit components LS and the high-side circuit components HS can be arranged either onto separate lead frames LF or onto a common lead frame LF. A drain pad DP of the low-side chip package portion LS is connected to an output electrode OE which is accessible from outside the half-bridge semiconductor chip package 500 wherein a drain pad DP of the high-side chip package portion HS is connected to a drain electrode DE which is also accessible from outside the half-bridge semiconductor chip package 500.

As shown in FIG. 7, a lateral structure of a semiconductor chip package 500 is provided, i.e., a drain pad DP of the logic switching driver circuit 302, a source pad SP of the high-voltage switching transistors 101, the transistor bodies, and the drain pads DP of the high-voltage switching transistors 101 are arranged on top of each other, in a vertical direction. The logic switching driver circuit 302 is arranged directly onto the lead frame LF. The gate G of the high-voltage switching transistor 101 is connected to a gate pad GP provided on the upper surface of the logic switching driver circuit 302.

Further chip package arrangements of the low-side circuitry LS and the high-side circuitry HS, respectively correspond to the semiconductor chip package 400 described herein above with respect to FIG. 6. With reference to FIG. 7, the cross sectional view of the half-bridge semiconductor chip package 500 can be designed as a single-chip package including integrated logic switching driver circuits 302 for low side LS and high side circuitry HS of the half-bridge electrical device, according to an embodiment which can be combined with other embodiments described herein. The illustrated solid-state switching device, with the exception of the high voltage switching transistor 101, can be manufactured in a single chip package, i.e., on the lead frame LF including the integrated logic switching driver circuit 302. In other words, the switching driver circuit 301, the logic circuit 103 and/or the low-voltage driver transistor 104 can be monolithically integrated into a single semiconductor component, e.g., on a single semiconductor substrate.

Although not shown in FIG. 7, the integrated logic switching driver circuit 302 can be replaced by the switching driver circuit 301 alone which has been indicated in FIG. 5. The switching driver circuit 301 or the integrated logic switching driver circuit 302 can then be provided with one or more additional input terminals 303 adapted for connecting other circuit components.

It is noted here that the high-voltage switching transistor 101 and the switching driver circuit 301 or the integrated logic switching driver circuit 302 can form a single semiconductor chip package 400, e.g., a one-piece electronic circuit component. The single semiconductor chip package 400 includes externally accessible connection terminals that are represented by, but are not limited to, the drain electrode DE, the lead frame LF being connected to ground, the optional output electrode OE (output pad), and the optional one or more input terminals 303.

Due to the lateral technology used for chip package setup, only the gate pad GP and the drain pad DP need be provided at the switching driver circuit 301 and the integrated logic switching driver circuit 302, respectively, for connecting the circuits 301, 302 to the respective high-voltage switching transistors 101. The switching driver circuit 301 and the integrated logic switching driver circuit 302, respectively, can be bonded onto the lead frame LF.

Figure 8:
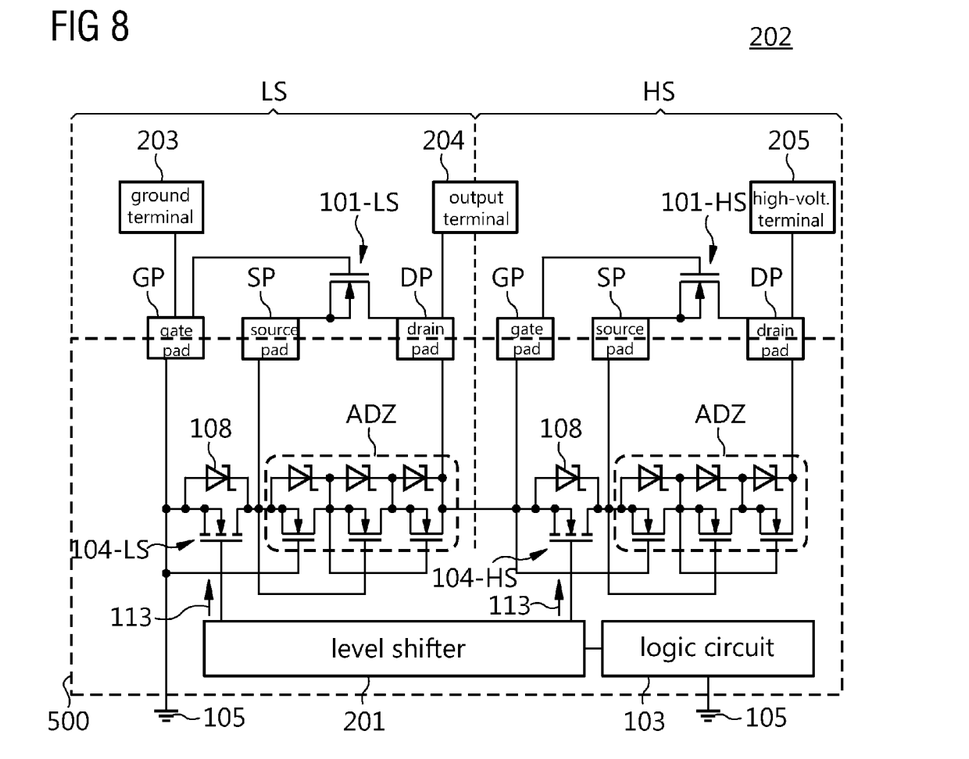
FIG. 8 illustrates a detailed circuit diagram of a half-bridge circuit, according to embodiments.

FIG. 8 illustrates, in a detailed circuit diagram, one possible application of a switching device 100, according to embodiments which can be combined with other embodiments described herein. FIG. 8 depicts a setup diagram of a half-bridge circuit 202 having a high-side circuitry HS and a low-side circuitry LS. Low-side LS and high-side HS circuit components are arranged in a similar manner. Furthermore, two high-voltage switching transistors 101-LS, 101-HS are connected to low-side circuitry LS and high-side circuitry HS, respectively, via dedicated terminals, i.e., associated gate pads GP, source pads SP and drain pads DP, respectively. The circuitry within the dashed line represents the half-bridge semiconductor chip package 500 that has been described herein above with respect to FIG. 7.

The half-bridge semiconductor chip package 500 includes the logic circuit 103 and a level shifter 201. The level shifter 201 electrically connects the respective gates of the low-voltage driver transistors 104-LS, 104-HS to the logic circuit 103. Since the logic circuit 103 is operated relative to ground 105 which corresponds to the source potential of the low-side driver transistor 104-LS, the level-shifter 201 is used to shift voltages appearing at the output of the logic circuit 103, to the voltages needed at the respective gates of the low-side driver transistor 104-LS and the high-side driver transistor 104-HS. Thereby, the level shifter 201 can provide appropriate control signals 113 for the low-voltage driver transistors 104-LS, 104-HS both at the low-side circuitry LS and at the high-side circuitry HS. The reason is that the gate voltages should be defined relative to the source of the respective transistor and the voltage at the source terminal can significantly differ with respect to the voltage at the drain terminal.

In addition to that, the half-bridge semiconductor chip package 500 includes an active drift zone circuitry ADZ, both at the low side LS and at the high side HS. The active drift zones ADZ can include a predetermined number of drift zone transistors (in the setup depicted in FIG. 8 the number is three), each having a load path between a first and a second connection terminal. The respective load paths of the drift zone transistors are serially connected to the load path of the associated low-voltage driver transistors 104-LS for the low side LS and 104-HS for the high side HS.

Each of the drift zone transistors has its gate terminal connected to the source terminal of the preceding drift zone transistor. The drift zone transistor, the source of which is connected to the drain terminal of the low-voltage driver transistor 104-LS or 104-HS, respectively, has its gate terminal connected to the source terminal of the low-voltage driver transistor 104-LS or 104-HS, respectively.

A voltage blocking capability and an on-resistance (Ron) of the low-side LS and the high-side switching circuitry HS thus are based both on the voltage blocking capability and an on-resistance (Ron) of the high-voltage switching transistors 101-LS, 101-HS and the associated active drift zone ADZ, respectively.

Connection terminals of the half-bridge semiconductor chip package 500 to external circuit components are represented by a ground terminal 105, and the connection terminals for the two high-voltage switching transistors 101-LS, 101-HS, i.e., the two gate pads GP, the two source pads SP and the two drain pads DP. Hereby, the gate pad GP of low-side circuitry LS represents a half-bridge ground terminal, the drain pad DP of low-side circuitry LS represents a half-bridge output terminal 204, and the drain pad DP of high-side circuitry HS represents a half-bridge high-voltage terminal 205.

Referring now back to FIG. 7, the half-bridge output terminal 204 corresponds to the output electrode OE described herein above with respect to FIG. 7, the half-bridge ground terminal 203 (half-bridge source terminal) corresponds to the connection of the lead frame LF shown in FIG. 7, and the half-bridge high-voltage terminal 205 corresponds to the drain electrode DE of FIG. 7.

Figure 9:
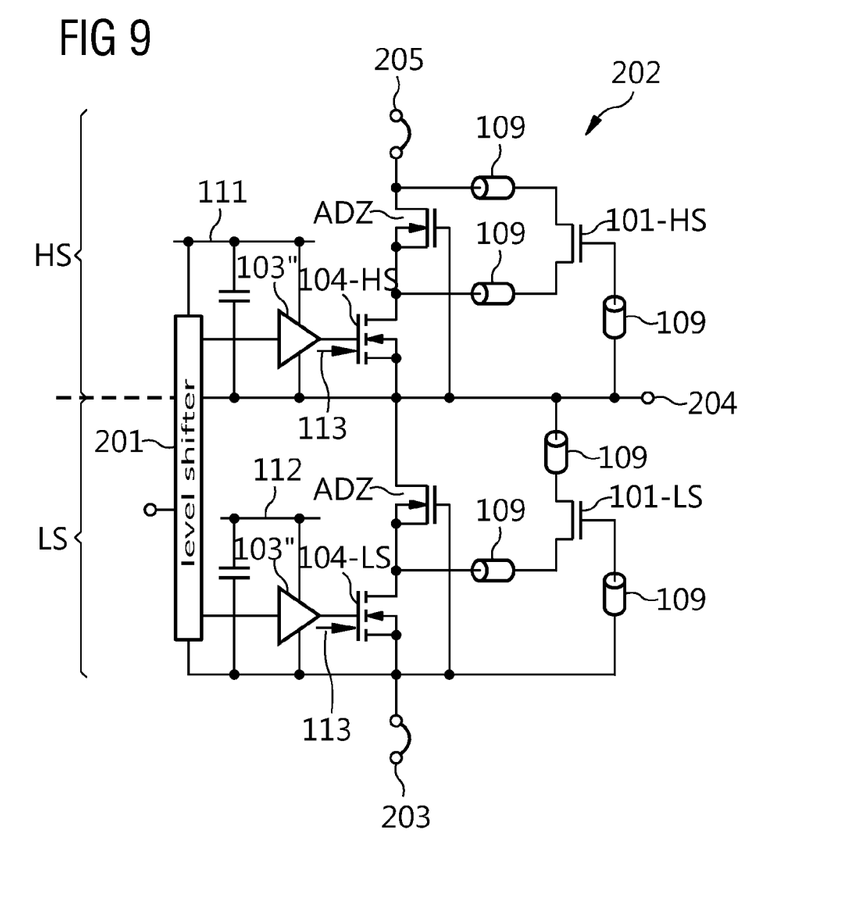
FIG. 9 illustrates a detailed circuit diagram of a half-bridge circuit, according to embodiments.

FIG. 9 illustrates a detailed circuit diagram of a half-bridge circuit 202, according to a further embodiment which can be combined with other embodiments described herein. As shown in FIG. 9, an exemplary application of high-voltage semiconductor switching devices arranged in the half-bridge circuit 202 is provided. The half-bridge circuit 202 corresponds to the circuit setup depicted in FIG. 8.

A high-side switching device HS and a low-side switching device LS are combined to form the half-bridge circuit 202. As has already been indicated in FIG. 8, the two high-voltage switching transistors 101-LS and 101-HS which provide switching of the output terminal 204 of the half-bridge circuit 202 are arranged external with respect to the integrated logic switching driver circuit 302 discussed herein with respect to FIG. 7. Thereby, a connection of the drain terminal, the gate terminal and the source terminal of the low-side high-voltage switching transistor 101-LS and a connection of the drain terminal, the gate terminal and the source terminal of the high-side high-voltage switching transistor 101-HS to the integrated logic switching driver circuit 302 are provided by means of respective vias 109. In this way, the source terminal of the high-voltage switching transistor 101-HS is connected to the drain terminal of the high-side low-voltage driver transistor 104-HS, the gate terminal is connected to the half-bridge output terminal 204, and the drain terminal is connected to the half-bridge high-voltage terminal 205.

High-side HS and low-side LS amplifier/logic circuits 103" are provided with a first supply voltage 111 and with a second supply voltage 112, respectively. Low-side switching circuit and high-side switching circuit can be represented by n-type enhancement FETs. Furthermore, the source terminal of the high-voltage switching transistor 101-LS at the low side LS is connected to the drain terminal of the low-side low-voltage driver transistor 104-LS, the gate terminal is connected to the half-bridge ground terminal 203, and the drain terminal is connected to the half-bridge output terminal 204.

Referring now back to in FIG. 7, the half-bridge output terminal 204 corresponds to the output electrode OE described herein above with respect to FIG. 7, the half-bridge ground terminal 203 (half-bridge source terminal) corresponds to the connection of the lead frame LF shown in FIG. 7, and the half-bridge high-voltage terminal 205 corresponds to the drain electrode DE of FIG. 7.

Figure 10:
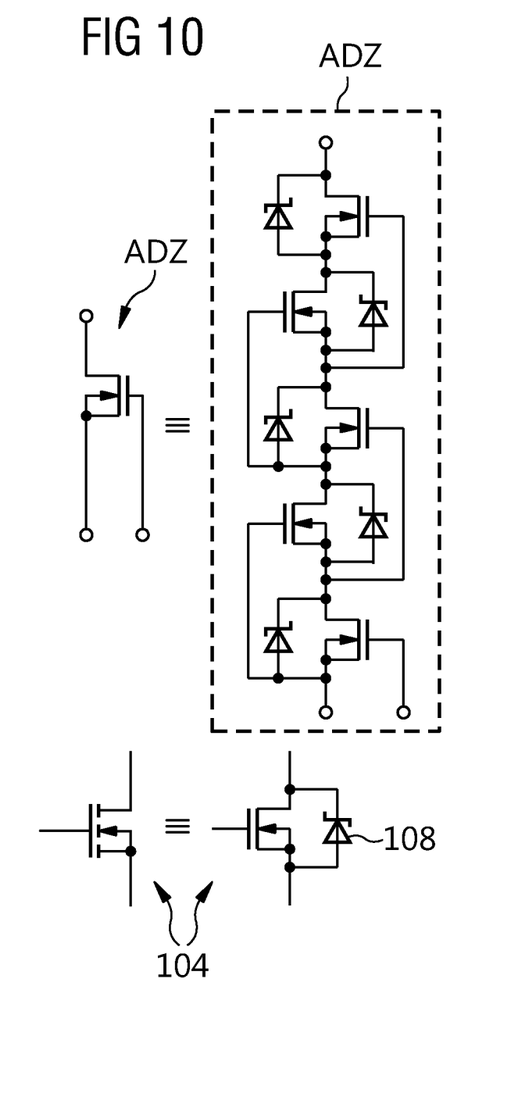
FIG. 10 illustrates a circuit detail related to active drift zone.

FIG. 10 illustrates a circuit detail related to an active drift zone ADZ, according to embodiments. The active drift zone ADZ includes a predetermined number of drift zone transistors (in the setups depicted in FIG. 8 the number is three and in FIG. 10 the number is five), each having a load path between a first and a second connection terminal. With respect to FIGS. 9 and 10, the active drift zone ADZ can be represented by a single transistor circuit symbol ADZ.

The respective load paths of the drift zone transistors are serially connected to the load path of the associated low-voltage driver transistors 104-LS, 104-HS shown in FIG. 9. Each of the drift zone transistors has its gate terminal connected to the source terminal of the preceding drift zone transistor. The drift zone transistor, the source of which is connected to the drain terminal of the low-voltage driver transistor 104-LS, 104-HS has its gate terminal connected to the source terminal of the low-voltage driver transistor 104-LS, 104-HS.

Further with respect to FIGS. 9 and 10, the low-voltage switching transistor 104-LS, 104-HS can include the body diode 108 connected in parallel to its source-drain path, wherein the anode of the body diode 108 is connected to the source of transistor 104-LS, 104-HS and the cathode is connected to the drain of transistor 104-LS, 104-HS. The combination circuit of transistor and body diode 108 can be represented by a single circuit symbol indicated in FIG. 10 by a reference numeral 104.

In order to reduce the electrical resistance of the load path between the source pad SP and the drain pad DP, the high-voltage switching transistors 101-LS, 101-HS are connected in parallel to the drift zone transistors ADZ. Thereby, the ADZ drift zone transistors together with the low voltage transistors 104-LS, 104-HS can be used to define the relative voltage at each terminal and to control the switching behaviour, whereas the high-voltage switching transistors 101-LS, 101-HS reduce the overall resistance of the circuit. The benefit of using an ADZ structure is that it can be implemented as a monolithically integrated half-bridge in a lateral arrangement on a single semiconductor substrate, e.g., made of silicon. The arrangement can be provided in a source-down configuration. The transistors 101-LS, 101-HS can be provided as low-ohmic devices, whereas the ADZ transistors can be small in size, i.e., can be provided as high-ohmic devices, because electrical resistance and capacitance of the high-voltage path are mainly defined by the high-voltage transistors 101-LS, 101-HS. Moreover, the high-voltage transistors 101-LS, 101-HS can be provided as wide-bandgap semiconductors, which are reduced in size as compared to similar low-ohmic devices based on silicon. The series connection of the drift zone transistors ADZ can be switched on and off by applying an appropriate voltage, i.e., an appropriate control signal 113 at the gate terminal of the respective low-voltage driver transistors 104-LS, 104-HS.

In view of the above, a method for switching a high voltage thus includes generating a switching signal; applying the switching signal at a low-voltage driver transistor comprising a source, a drain and a gate; transferring the switching signal to a high-voltage switching transistor; and on the basis of the transferred switching signal, switching the high voltage by means of the high-voltage switching transistor connected in series to the low-voltage driver transistor and being arranged source-down on top of the drain of the low-voltage driver transistor.

Spatially relative terms such as "under", "below", "lower", "over", "upper" and the like are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A solid-state switching device, comprising:
a high-voltage switching transistor comprising a source, a drain and a gate, and being adapted for switching a high voltage on the basis of a switching signal; and
a switching driver circuit operationally connected to the high-voltage switching transistor, the switching driver circuit comprising a low-voltage driver transistor comprising a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

2. The solid-state switching device of claim 1, further comprising a logic circuit operationally connected to the low-voltage driver transistor and adapted for providing the switching signal.

3. The solid-state switching device of claim 1, wherein the high-voltage switching transistor and the low-voltage driver transistor are electrically connected in a cascode circuit.

4. The solid-state switching device of claim 1, wherein the high-voltage switching transistor is a field-effect depletion-mode transistor.

5. The solid-state switching device of claim 1, wherein the high-voltage switching transistor is selected from the group consisting of a MOSFET, a MISFET, an IGFET, an IGBT, a JFET, a HEMT, a FINFET or a nanotube device.

6. The solid-state switching device of claim 1, wherein the low-voltage driver transistor is a field-effect enhancement-mode transistor.

7. The solid-state switching device of claim 1, wherein the low-voltage driver transistor is selected from the group consisting of a MOSFET, a MISFET, an IGFET, an IGBT, a JFET, a HEMT, a FINFET or a nanotube device.

8. The solid-state switching device of claim 1, wherein the switching driver circuit and the high-voltage switching transistor are provided as a stack.

9. The solid-state switching device of claim 1, wherein the switching driver circuit is provided as a single semiconductor chip package.

10. The solid-state switching device of claim 1, wherein the high-voltage switching transistor comprises one of the following materials or compositions thereof: Si, SiO, SiN, Ge, Ga, Al, GaAs, GaN, C, In, InP, SiC, HfO.

11. A solid-state switching device, comprising:
a high-voltage switching transistor comprising a source, a drain and a gate, and being adapted for switching a high-voltage on the basis of a switching signal; and
an integrated logic switching driver circuit operationally connected to the high-voltage switching transistor, the integrated logic switching driver circuit comprising a logic circuit adapted for generating the switching signal for the high-voltage switching transistor, and a switching driver circuit comprising a low-voltage driver transistor comprising a source, a drain and a gate, connected in series to the high-voltage switching transistor and being adapted for transferring the switching signal to the high-voltage switching transistor, wherein the high-voltage switching transistor is arranged source-down on top of the drain of the low-voltage driver transistor.

12. The solid-state switching device of claim 11, wherein the high-voltage switching transistor and the low-voltage driver transistor are electrically connected in a cascode circuit.

13. The solid-state switching device of claim 11, wherein the high-voltage switching transistor is a field-effect depletion-mode transistor.

14. The solid-state switching device of claim 11, wherein the high-voltage switching transistor is selected from the group consisting of a MOSFET, a MISFET, an IGFET, an IGBT, a JFET, a HEMT, a FINFET or a nanotube device.

15. The solid-state switching device of claim 11, wherein the low-voltage driver transistor is a field-effect enhancement-mode transistor.

16. The solid-state switching device of claim 11, wherein the low-voltage driver transistor is selected from the group consisting of a MOSFET, a MISFET, an IGBT, a JFET, a HEMT, a FINFET or a nanotube device.

17. The solid-state switching device of claim 11, wherein the integrated logic switching driver circuit and the high-voltage switching transistor are provided as a stack.

18. The solid-state switching device of claim 11, wherein the integrated logic switching driver circuit is provided as a single semiconductor chip package.

* * * * *